United States Patent
Miyashita et al.

(10) Patent No.: US 6,901,016 B2
(45) Date of Patent: May 31, 2005

(54) SEMICONDUCTOR MEMORY DEVICE AND ELECTRONIC INSTRUMENT USING THE SAME

(75) Inventors: Koji Miyashita, Matsumoto (JP); Tadatoshi Nakajima, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 96 days.

(21) Appl. No.: 10/313,910

(22) Filed: Dec. 6, 2002

(65) Prior Publication Data

US 2003/0128607 A1 Jul. 10, 2003

(30) Foreign Application Priority Data

Dec. 6, 2001 (JP) .................................... 2001-373158

(51) Int. Cl.[7] ............................................... G11C 7/00
(52) U.S. Cl. ........................ 365/203; 365/154; 365/191
(58) Field of Search ................................. 365/203, 154, 365/191, 225.7

(56) References Cited

U.S. PATENT DOCUMENTS 6,018,488 A * 1/2000 Mishima et al. ......... 365/225.7
6,181,640 B1 * 1/2001 Kang ....................... 365/233.5
6,434,065 B1 * 8/2002 Kobayashi et al. ......... 365/200
6,452,862 B1 * 9/2002 Tomotani ............... 365/230.06
6,594,192 B1 * 7/2003 McClure .................. 365/225.7

* cited by examiner

Primary Examiner—Hoai Ho
(74) Attorney, Agent, or Firm—Hogan & Hartson, LLP

(57) ABSTRACT

A semiconductor memory device has a first precharge transistor connecting a potential supply line to one end of a bit line when the bit line is precharged and a second precharge transistor connecting the potential supply line to the other end of the bit line when the bit line is precharged. To a gate of the first precharge transistor is inputted a first precharge signal, and to a gate of the second precharge transistor is inputted a second precharge signal generated based on a chip-select signal and the first precharge signal. The second precharge transistor is brought into a cut-off state during a standby state in which a memory cell corresponding to the second precharge transistor does not read nor write data but holds date.

14 Claims, 11 Drawing Sheets

SEMICONDUCTOR MEMORY DEVICE AND ELECTRONIC INSTRUMENT USING THE SAME

Japanese patent application no. 2001-373158, filed on Dec. 6, 2001, is hereby incorporated by reference in its entirety.

BACKGROUND OF THE INVENTION

The present invention relates to a semiconductor memory device such as a SRAM and an electronic instrument using the same.

In a semiconductor memory device having a memory cell such as a static random access memory (SRAM) and a dynamic random access memory (DRAM), increasing both a packing density and a speed is always a very important object. Then, in this kind of semiconductor memory device, the number of memory cells in the direction along a word line and in the direction along a bit line increases with increasing the packing density.

When the number of memory cells in the direction along the word line increases, the number of memory cells directly connected to one word line increases and a load resistance and a load capacity of the one word line increase, which makes it difficult to selectively drive the word line at a high speed.

Thus, a memory cell array is divided into a plurality of memory blocks in the direction along the word line and a plurality of main word lines are arranged across the plurality of memory blocks. Further, in each of the plurality of memory blocks are arranged a plurality of sub word lines following each of the plurality of main word lines. Reducing the load capacity of the one main word line in this manner enables a high speed driving.

On the other hand, in the semiconductor memory device such as the SRAM, in a period of a state in which data is not read or written but is held, that is, in a period of a stand-by state, the bit line has a high potential such as a power source voltage. However, when the bit line is put into contact with a wiring layer having a low potential such as a ground wiring or the word line by a foreign matter mixed in a manufacturing process, a short-circuit current is passed through the bit line to cause a current failure in the bit line. As a relief measure against the current failure like this, there is a technology in which a fuse is provided between the bit line and a power source terminal and is cut by the use of a laser or the like to enable the bit line causing the current failure to be separated from the power source.

This kind of fuse is formed of a conductive material such as polysilicon, tungsten silicide, or aluminum and in order to enable the fuse to be cut by the use of the laser or the like, it is necessary to arrange the fuses at sufficient wide intervals and to narrow their widths. Thus, a portion where the fuse is arranged has higher resistance as compared with a usual wiring layer. In addition, as described above, since the number of memory cells connected to the respective bit lines increases with increasing the packing density, there is a possibility that initializing to a high logic level necessary for an action of reading data by precharging the bit line before switching a state of selection of the word line can not be performed at a sufficient high speed. This results in reducing an access speed in the semiconductor memory device.

BRIEF SUMMARY OF THE INVENTION

The present invention has been made in view of the above-mentioned problems and may provide a semiconductor memory device capable of realizing increasing a packing density and a speed and an electronic instrument using the same.

A semiconductor memory device in accordance with one aspect of the present invention includes a memory cell array including a plurality of memory cells arranged in a first direction and in a second direction and a plurality of bit lines, each of the bit lines being connected in common to the plurality of memory cells arranged in the first direction.

The semiconductor memory device also includes a first precharge switch, connected to a potential supply line via a fuse and connected to one end of each of the bit lines, the potential supply line supplying a predetermined potential, and the first precharge switch connecting the potential supply line to each of the bit lines when the bit lines are precharged to the predetermined potential.

The semiconductor memory device further includes a second precharge switch, connected to the potential supply line and connected to the other end of each of the bit lines, the second precharge switch connecting the potential supply line to each of the bit lines when the bit lines are precharged to the predetermined potential. The second precharge switch is in a cut-off state during a standby period in which memory cells corresponding to the second precharge switch hold data without reading and writing data.

According to this aspect of the present invention, the first and second precharge switches, which are connected to the bit line and the potential supply line to precharge the bit line at the predetermined potential, are connected to the one side and the other end of the bit line, respectively. Moreover, a fuse is provided in order to prepare for a case where a load capacity is increased with an increase in the number of memory cells connected to the respective bit lines due to a higher integration and for a case where a current failure is caused in the bit line by a short circuit due to a mixture of a foreign matter or the like. In this aspect, it is possible to reduce a decrease in a precharge speed caused by an increase in the resistance of the bit line caused by provision of the fuse and higher integration, as compared with a case where a precharge switch is connected only to the one end of the bit line.

Moreover, the second precharge switch is in the cut-off state during the standby state in which the memory cell corresponding to the second precharge switch does not read nor write data but holds data. Thus, even if the current failure occurs in the bit line by the short circuit due to the mixture of the foreign matter or the like, it is possible to prevent an unnecessary current from flowing from the second precharge switch to a place where a short circuit occurs, if data is not read from and written to the memory cell connected to the bit line.

This semiconductor memory device may further include a chip-select signal input terminal to which a chip-select signal is inputted, the chip-select signal controlling whether or not the memory cells are in a state to read and write data.

Here, each of the first and second precharge switches may have a first terminal, a second terminal and a control terminal. A signal for controlling conduction between the first terminal and the second terminal may be inputted to the control terminal.

In this case, a first precharge signal may be inputted to the control terminal of the first precharge switch, and a second precharge signal may be inputted to the control terminal of the second precharge switch. The second precharge signal may be generated based on the chip-select signal and the first precharge signal.

In this manner, a conduction between the first terminal and the second terminal in each of the first and second precharge switches can be controlled by the first and second precharge signals inputted to the control terminal.

Moreover, it is possible to generate the second precharge signal based on the chip-select signal and the first precharge signal, and to control the second precharge switch in the cut-off state during the standby state by means of the generated second precharge signal.

In this aspect, the memory cell array may be divided into a plurality of block regions. In this case, the first precharge signal may become active when both a precharge base signal and a block-selecting signal become active, and precharging may be performed.

A semiconductor memory device in accordance with another aspect of the present invention includes a memory cell array including a plurality of memory cells arranged in a first direction and in a second direction and a plurality of bit lines, each of the bit lines being connected in common to the plurality of memory cells arranged in the first direction.

The semiconductor memory device also includes a first precharge switch, connected to a potential supply line via a fuse and connected to one end of each of the bit lines, the potential supply line supplying a predetermined potential, and the first precharge switch connecting the potential supply line to each of the bit lines when the bit lines are precharged to the predetermined potential and a second precharge switch, connected to the potential supply line and connected to the other end of each of the bit lines, the second precharge switch connecting the potential supply line to each of the bit lines when the bit lines are precharged to the predetermined potential.

Each of the first and second precharge switches is in a cut-off state during a standby period in which memory cells corresponding to the first and second precharge switches hold data without reading and writing data.

According to this aspect of the present invention, the first and second precharge switches that are connected to the bit line and the potential supply line to precharge the bit line at the predetermined potential are connected to the one side and the other end of the bit line, respectively. Thus, it is possible to reduce a decrease in a precharge speed caused by an increase in a load capacity and in the resistance of the bit line, due to an increase in the number of memory cells connected to the respective bit lines because of a higher integration, as compared with a case where the precharge switch is connected only to the one end of the bit line.

Moreover, the first and second precharge switches are in the cut-off state during the standby state in which the memory cells corresponding to the first and second recharge switches do not read and write data but hold data. Thus, even if the current failure occurs in a bit line by a short circuit, it is possible to prevent an unnecessary current from flowing from the first and second precharge switches to a place where the short circuit occurred, if date is not read from and written to a memory cell connected to the bit line.

This semiconductor memory device may further include a chip-select signal input terminal to which a chip-select signal is inputted, the chip-select signal controlling whether or not the memory cells are in a state to read and write data. Here, each of the first and second precharge switches may have a first terminal, a second terminal and a control terminal. A signal for controlling conduction between the first terminal and the second terminal may be inputted to the control terminal. In this case, a precharge signal may be inputted to the control terminal of each of the first and second precharge switches. The precharge signal may control the first terminal and the second terminal so that the first and second terminals are not brought into conduction during the standby period in which the chip-select signal is inactive.

In this manner, by the precharge signal inputted to the control terminals of the first and second precharge switches, the first and second precharge switches can be controlled to the cut-off state during the standby state in which memory cells corresponding to the first and second precharge switches do not read nor write data but hold data.

In this aspect, the memory cell array may be divided into a plurality of block regions. In this case, the precharge signal may become active when all of a precharge base signal, a block selecting signal, and the chip-select signal become active.

An electronic instrument in accordance with a further aspect of the present invention includes any of the semiconductor memory devices described above.

DETAILED DESCRIPTION OF THE EMBODIMENT

Figure 1:
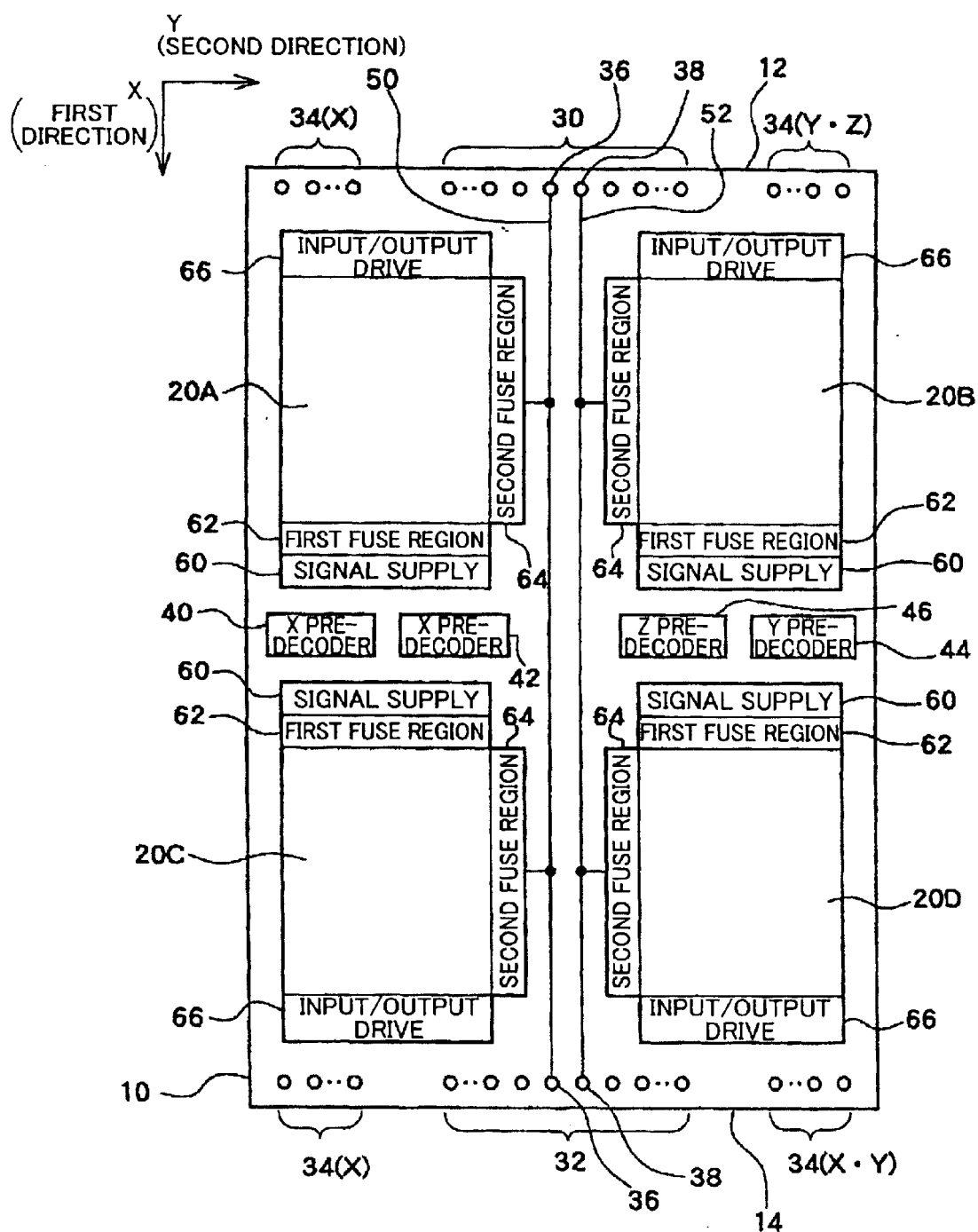
FIG. 1 is a plan layout of a semiconductor memory device in accordance with one embodiment of the present invention.

The embodiments of the present invention will be described specifically with reference to the drawings.
First Embodiment
Plan Layout of a Semiconductor Memory Device FIG. 1 shows one example of a plan layout of a semiconductor memory device in accordance with an embodiment of the present invention. Here, in this embodiment will be described an example in a case where the semiconductor memory device is a static random access memory (SRAM). In FIG. 1, this semiconductor memory device 10 has, for example, four memory cell arrays 20A, 20B, 20C, and 20D. The memory capacity of each of the memory cell arrays 20A to 20D is, for example, 4M bits and the total memory capacity becomes 4M×4=16M bits. In this respect, the present invention can be applied also to a device having another number of memory cell arrays, for example, one to three memory arrays.

The semiconductor memory device 10 can write or read data 16 bits (2 bytes) at the same time. Data of 8 lower order bits (lower order byte), for example, is read from or written to two upper memory cell arrays 20A and 20B in FIG. 1 via a group of input/output terminals 30 arranged along the upper side 12 of a semiconductor memory device 10, whereas data of 8 higher order bits (higher order byte), for example, is read from or written to two lower memory cell arrays 20C and 20D in FIG. 1 via a group of input/output terminals 32 arranged along the lower side 14 of the semiconductor memory device 10.

Address signals (X, Y and Z) of 20 bits, for example, each of which reads or writes data of 16 bits at the same time, are inputted by a group of address terminals 34 arranged along the upper side 12 and the lower side 14 of the semiconductor memory device 10. The address signals X, Y and Z inputted by the group of address terminals 34 are predecoded by X predecoders 40 and 42, a Y predecoder 44 and a Z predecoder 46.

Moreover, for example, the two memory cell arrays 20A and 20C arranged on the left side of the semiconductor memory device 10 are connected to a first power line 50 supplied with electric power from a power source terminal 36. Similarly, the two memory cell arrays 20B and 20D arranged on the right side, for example, of the semiconductor memory device 10 are connected to a second power line 52 supplied with the electric power from a power source terminal 38. In the present embodiment, there is not a case where two memory cell arrays connected to the same power line are selected at the same time so as to read or write data of 8 higher order bits and data of 8 lower order bits at the same time. Thus, the memory cell arrays 20A and 20D are selected at the same time or the memory cell arrays 20B and 20C are selected at the same time.

Here, the group of terminals arranged along the upper side 12 and the lower side 14 of the semiconductor memory device 10 include not only the above-mentioned group of terminals 30 to 38 but also control signal input terminals such as a clock signal input terminal for inputting a clock signal, a chip-select signal input terminal for inputting a chip-select signal CS-bar, and a write enabling signal input terminal.

Moreover, in each of the memory cell arrays 20A to 20D, a signal supply section 60 and a first fuse region 62 are arranged on a side near the predecoders 40 to 46 and an input/output drive circuit 66 is arranged on another side near the upper side 12 or the lower side 14, respectively. Further, in each of the memory cell arrays 20A to 20D, a second fuse region 64 is arranged in still another side near the power lines 50 and 52.

Here, in the first fuse region 62 are arranged a plurality of fuse devices for switching a faulty memory cell to a redundant memory cell. In the second fuse region 64 are arranged a plurality of fuse devices for interrupting the supplying of power to the faulty memory cell.

Detailed Description of the Memory Cell Array

Figure 2:
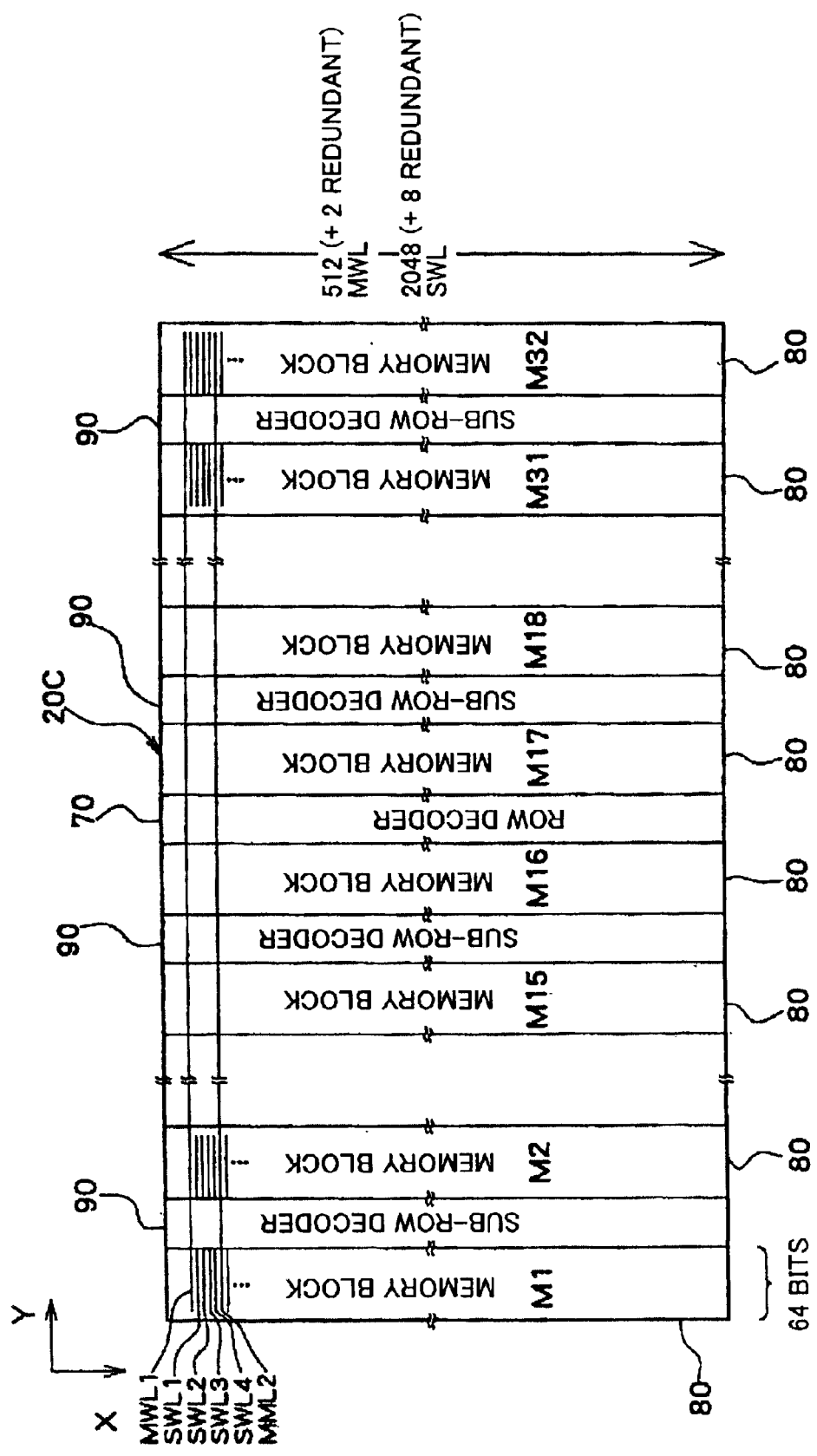
FIG. 2 is a schematic view showing one memory cell array in FIG. 1 in detail.

FIG. 2 is a schematic view showing a constitution that the memory cell arrays 20A to 20D have in common. In FIG. 2, for example, the memory cell array 20C has a row decoder 70 at the center in the Y-direction (in the direction along the word line). The memory cell array 20C is divided into 16 blocks at each of the two opposite sides of the row decoder 70. Thus, the memory cell array 20C is divided into 32 memory blocks 80 (M1 to M32) in total.

The memory capacity of one memory block is 64 bits (Y direction)×2048 bits (X direction: direction along the bit line)=128 k bits and the total memory capacity of the 32 memory blocks 80 becomes 4M bits. Here, each of the memory cell arrays 20A to 20D has a redundant memory block of 8 bits in addition to 32 memory blocks.

Between the two memory blocks 80 is arranged a sub row decoder 90 shared by both the memory blocks 80. Thus, there are provided a total of 16 sub row decoders 90. Note that one sub row decoder 90 may be provided for each of the memory blocks 80.

In the memory cell array 20C, for example, 512 main word lines MWL1, MWL2, . . . are arranged along the Y-direction, over the whole width in the Y-direction. Moreover, in addition to this, two redundant main word lines are provided.

Each of the 32 memory blocks 80 and the above-mentioned redundant memory block of 8 bits has four sub word lines SWL1 to SWL4, for example, subordinate to each of the 512 main word lines MWL and thus a total of 2,048 sub word lines SWL exist. Each of the 32 memory blocks 80 and the above-mentioned redundant memory block of 8 bits has a total of 8 sub word lines subordinate to two redundant main word lines.

Among the above-mentioned X, Y and Z address signals, the X and Y address signals indicate addresses in the X-direction and Y-direction shown in FIG. 1 and FIG. 2, and the Z address signal selects one block from among the 32 memory blocks 80.

The row decoder 70 selects one from the 512 main word lines MWL based on an X predecoding signal. The sub row decoder 90 selects one from four sub word lines SWL1 to SWL4 subordinate to the one selected main word line MWL in one memory block 80. For the selection of these four sub word lines SWL1 to SWL4, a Z predecoding signal (block selecting signal ZSB) and four lower order bits of the X predecoding signal are used.

In this manner, since one sub word line SWL is selected and the input/output drive circuit 66 selects pairs of bit lines for 8 bits based on the Y predecoding signal and the Z predecoding signal, 8-bit data can be read from or written to one memory block 80. In the present embodiment, two memory cell arrays are selected at the same time from among the four memory cell arrays 20A to 20D, and 8-bit data (total of 16-bit data) can be read or written at the same time in one memory block 80 of each of the two memory cell arrays.

Detailed Description of Sub Row Decoder

Figure 3:
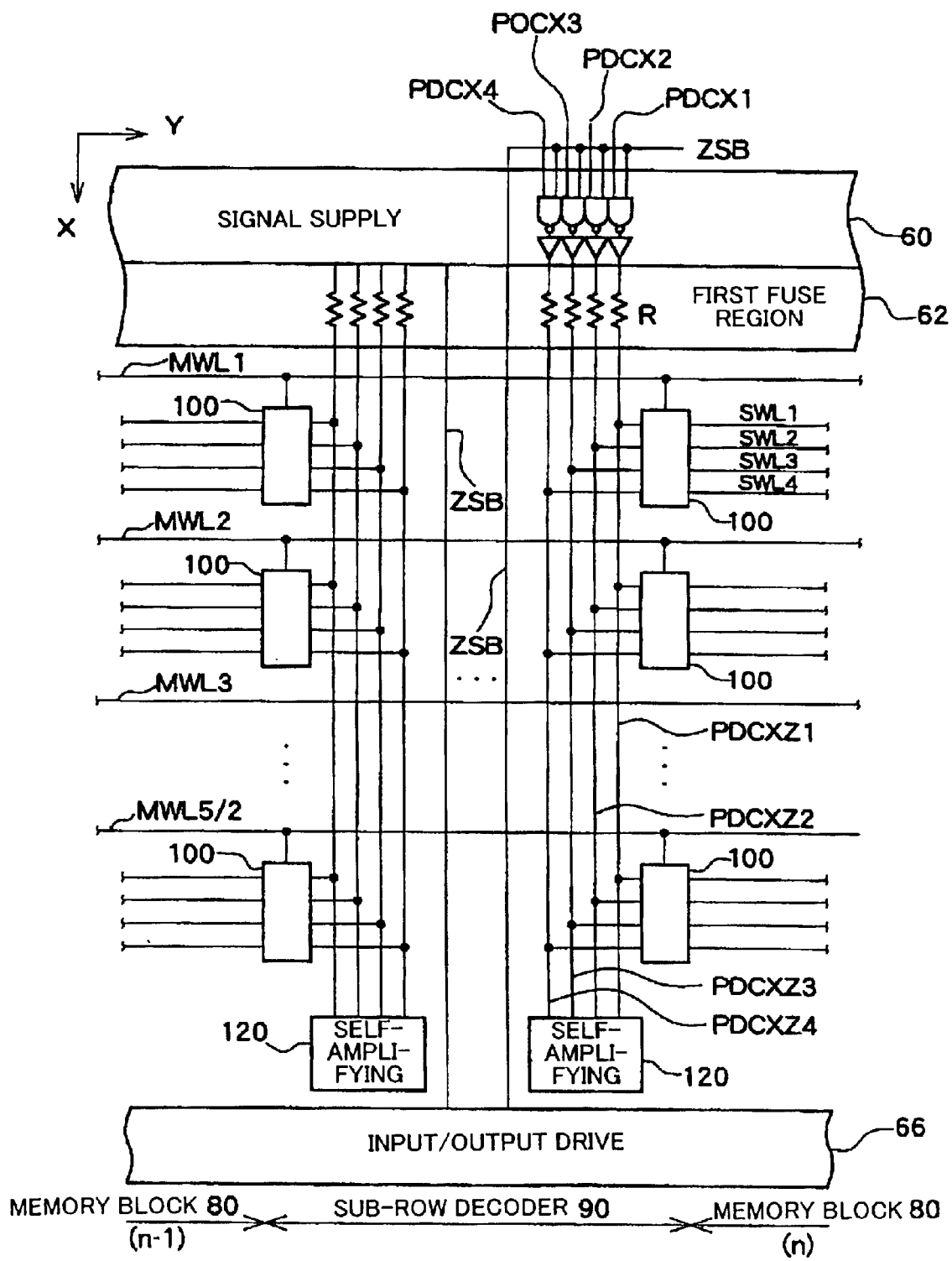
FIG. 3 is a circuit diagram showing a sub row decoder in FIG. 2 in detail.

FIG. 3 shows in detail the sub row decoder 90 shared by the (n−1)th and the n-th memory block regions 80. A common constitution for selecting the sub word lines SWL1 to SWL4 in the (n−1)th and the n-th memory blocks will be described below.

In this sub row decoder 90, four sub word selecting signal lines (X & Z predecoding signal lines) PDCXZ1 to PDCXZ4 extend along the X-direction. A sub word selecting signal that becomes active at high-level is supplied to each of the four sub word selecting signal lines PDCXZ1 to PDCXZ4. This each sub word selecting signal, as shown in FIG. 3, is generated based on a block selecting signal ZSB (low active) that is generated by predecoding a Z address signal by a Z predecoder 46 and X predecoded signals PDCX1 to PDCX4 (low active) of four lower order bits that are produced by predecoding an X address signal by the X predecoders 40 and 42. Moreover, in the sub row decoder 90, the above-mentioned block selecting signal line ZSB extends along the X-direction to the input/output drive circuit 66. This block selecting signal line ZSB is used for driving a sense amplifier in the input/output drive circuit 66 or driving a Y driver (bit line driving driver).

In order to select one sub word line SWL from among the 512 main word lines MWL1 to MWL512 and the four sub word selecting signal lines PDCXZ1 to PDCXZ4, there are provided 512 groups of switches 100.

Figure 4:
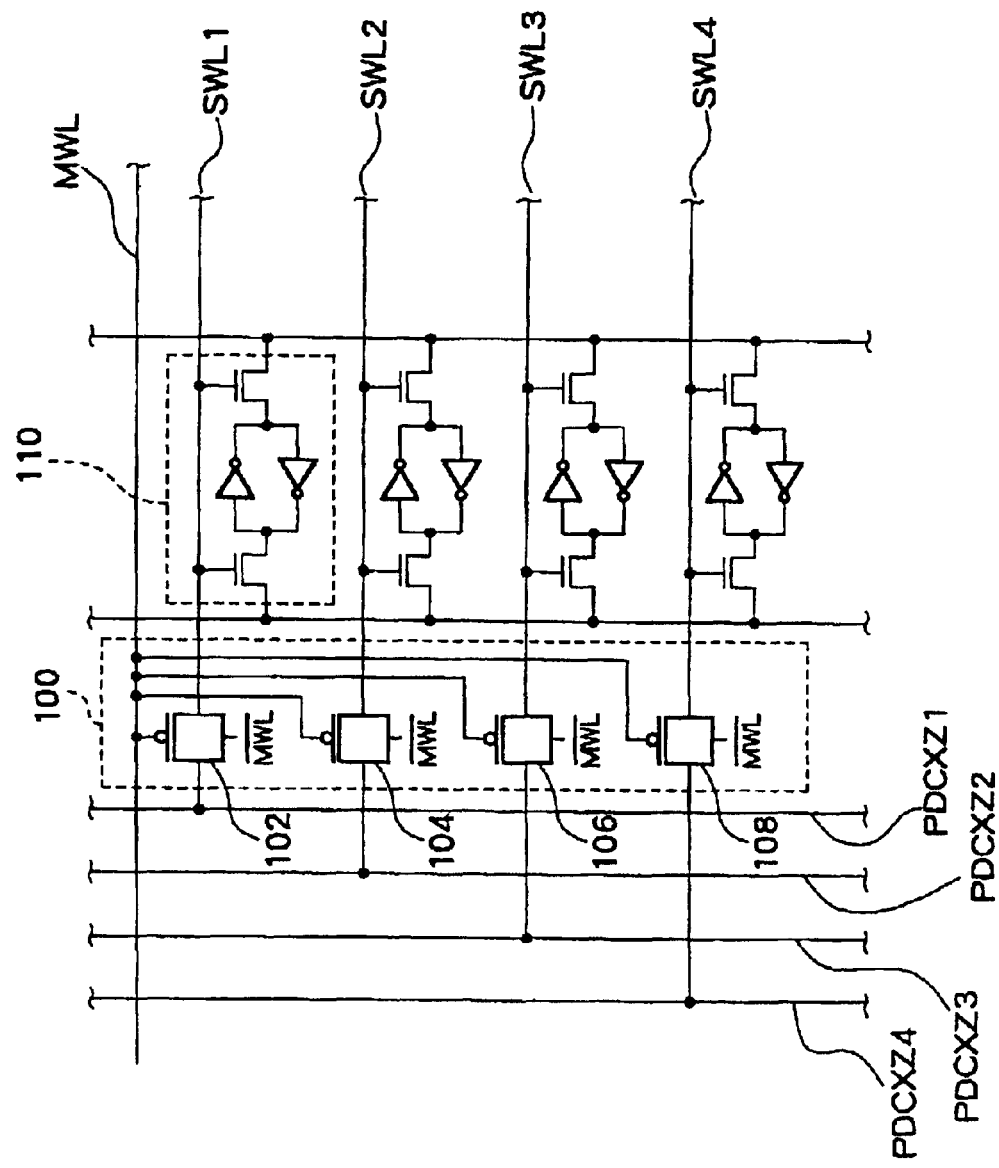
FIG. 4 is a circuit diagram showing a relationship among a group of switches, main word lines, sub-word lines, and sub word selecting signal lines in FIG. 3.

This each group of switches 100, as shown in FIG. 4, has four transfer gates 102, 104, 106, and 108. Each of the transfer gates 102 to 108 connects or disconnects one of the four sub word selecting signal lines PDCXZ to or from one sub word line SWL corresponding thereto based on a logic of a main word line MWL and an inverted main word line MWL-bar. Here, in the present embodiment, to the main word line MWL is supplied a low active main word selecting signal.

For example, when the potential of the main word line MWL1 is LOW and the potential of the sub word selecting signal line PDCXZ1 is HIGH and the potential of the other sub word selecting signal lines PDCXZ2 to PDCXZ4 is LOW, the potential of the sub word line SWL1 subordinate to the main word line MWL1 becomes HIGH. As a result, data can be read from or written to a memory cell 110 connected to the sub word line SWL1. Here, while only memory cells connected to the sub word lines SWL1 to SWL4 and the pair of bit lines (BLn and BLn-bar) are shown in this drawing, 64 memory cells are connected to each sub word line in each memory block 80.

Constitution in the Direction along the Bit Line

Figure 5:
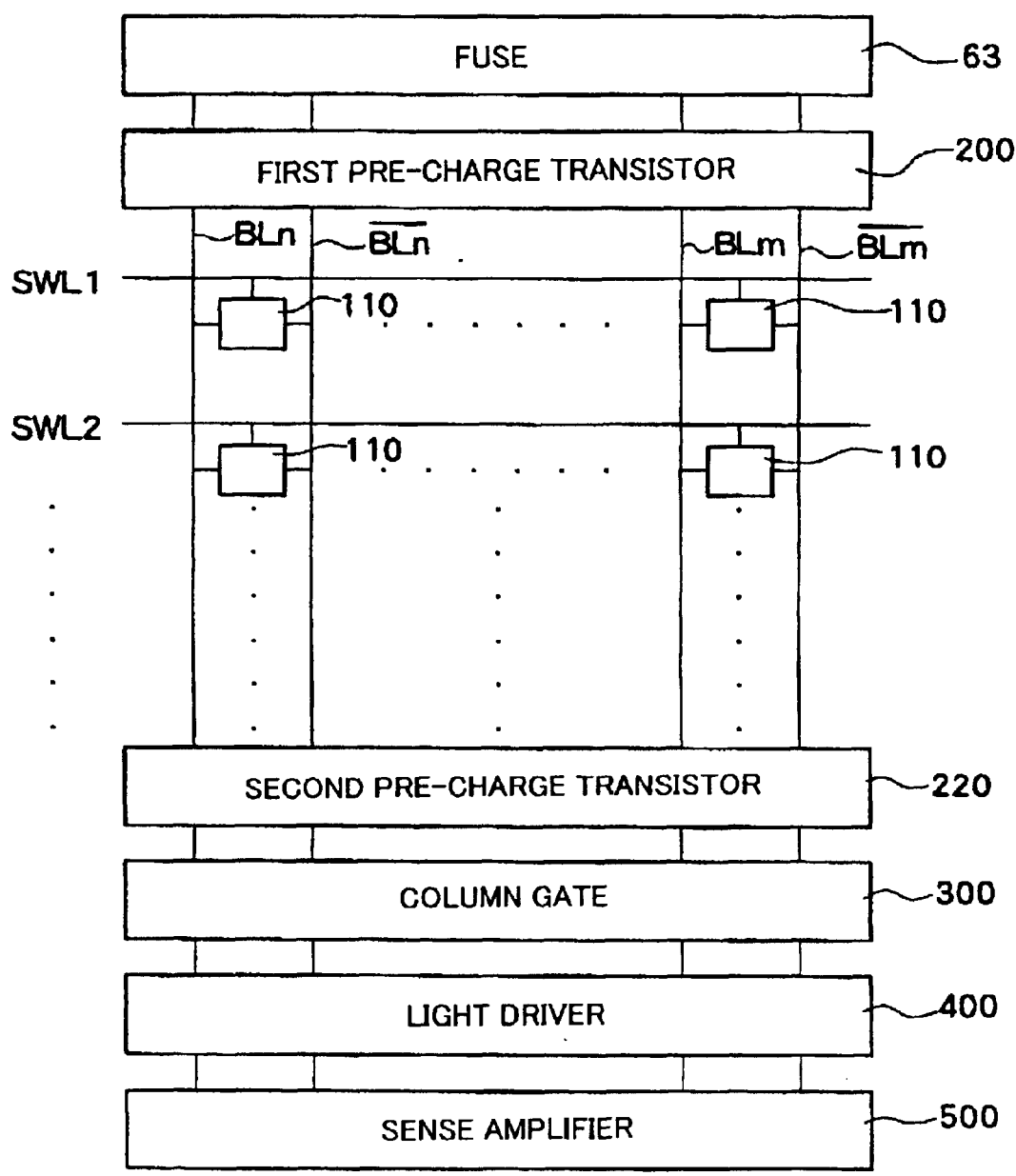
FIG. 5 is a block diagram showing an example of constitution in the direction along a bit line of a memory cell array.
Figure 6:
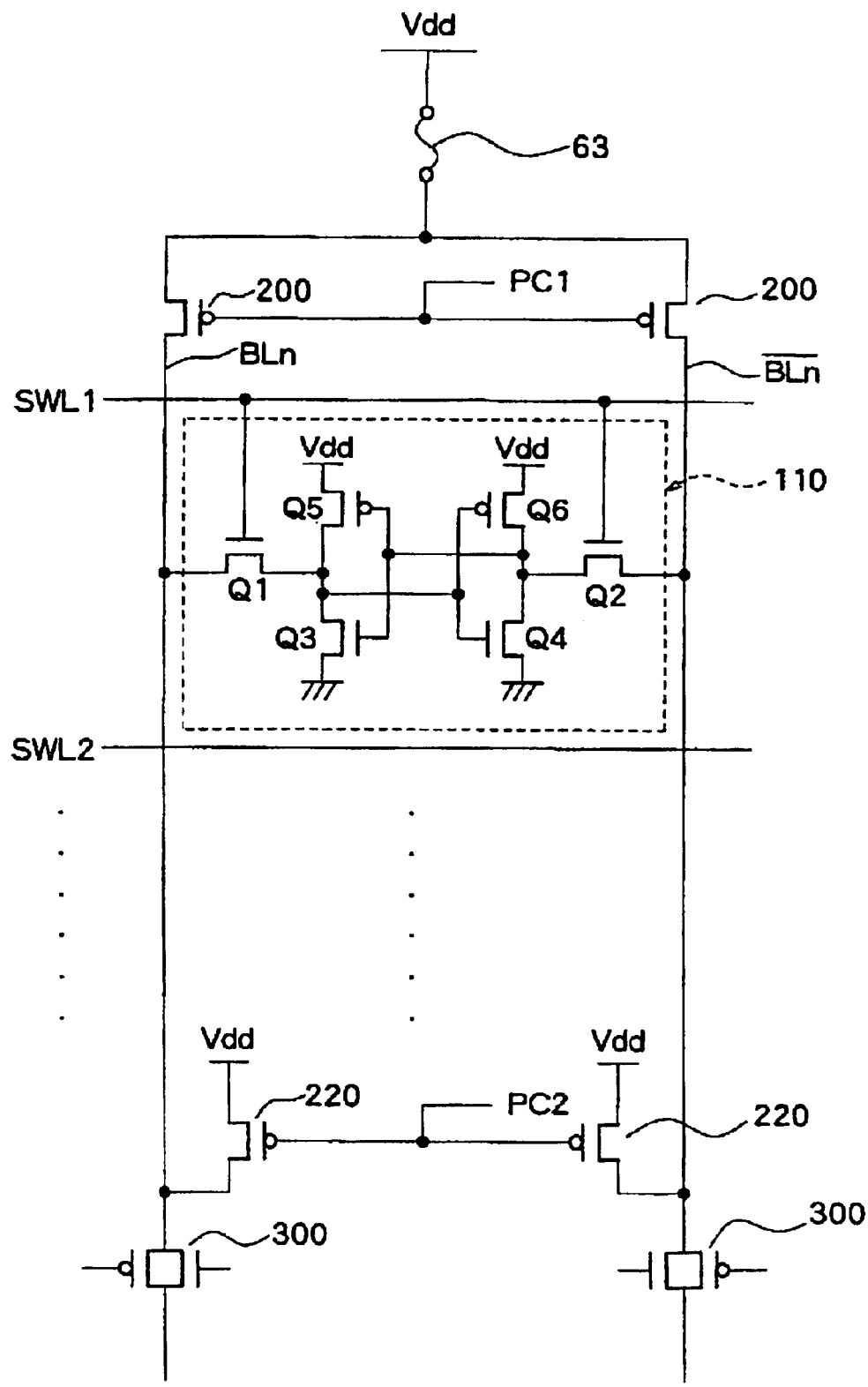
FIG. 6 illustrates a constitution from a fuse to a column gate shown in FIG. 5 in more detail.

FIG. 5 is a block diagram showing an example of a constitution in the direction along the bit line as an example of the memory cell array 20C in which data of 8 higher order bits is stored and its periphery. FIG. 6 shows a pair of bit lines BLn and BLn-bar to describe a constitution from a fuse 63 to a column gate 300, shown in FIG. 5, in more detail. In these drawings, the main word lines will be omitted. Although only one or two sub word lines and one or two memory cells are shown in these drawings, as described above, in practice, each of the 512 main word lines has the four sub word lines and one memory cell is arranged at each of positions where the sub word line crosses the pair of bit lines.

As shown in these drawings, in each bit line in each of the pairs of bit lines, for example, BLn and BLn-bar, one end is connected to a power source having a potential Vdd via the fuse 63 and a first precharge transistor (first precharge switch) 200 and the other ends are connected to a second precharge transistor (second precharge switch) 220 and a column gate 300. A signal line after the column gate 300 is further connected to a light driver 400 and a sense amplifier 500. A memory cell array region including many memory cells 110 is provided between the first precharge transistor 200 and the second precharge transistor 220, and a memory cell 110 is formed at a region where each pair of bit lines, for example, BLn and BLn-bar cross each sub word line, for example SWL1.

Each memory cell 110, as shown in FIG. 6, is constituted by 6 MOS transistors including transfer transistors Q1 and Q2, drive transistors Q3 and Q4, and load transistors Q5 and Q6. In this example, the transfer transistors Q1 and Q2 and the drive transistors Q3 and Q4 are NMOS transistors and the load transistors Q5 and Q6 are PMOS transistors. This memory cell has a constitution in which a flip-flop including the load transistors Q5 and Q6 and the drive transistors Q3 and Q4 is connected to the pair of bit lines BLn and BLn-bar via the transfer transistors Q1 and Q2.

Further specifically, the load transistor Q5 and the drive transistor Q3 are connected in series between a power source potential Vdd and a ground potential and the load transistor Q6 and the drive transistor Q4 are connected in the same manner. Then, both gates of the load transistor Q5 and the drive transistor Q3 are connected to a connection point of drains of the load transistor Q6 and the drive transistor Q4. Similarly, both gates of the load transistor Q6 and the drive transistor Q4 are connected to a connection point of drains of the load transistor Q5 and the drive transistor Q3. With such a constitution, the memory cell 110 acts as a flip-flop in which if any one of the drain connection points becomes an H level, the other drain connection point becomes an L level. Then, when the word line, for example, sub word line SWL1 is driven to the H level, the states of the respective drain connection points are outputted to the pair of bit lines BLn and BLn-bar via the transfer transistors Q1 and Q2, respectively.

The precharge transistors 200 as the first precharge switches are PMOS transistors and are connected to one ends of the respective bit lines of the pair of bit lines, for example, BLn and BLn-bar. Further, the pair of precharge transistors 200 are connected in common to the fuse 63 and a precharge signal PC1 is inputted in common to their gates. Then, the fuse 63 is connected to the power source that supplies the constant voltage Vdd. This enables the connection between one ends of the respective bit lines of the pair of bit lines, for example, BLn and BLn-bar, and the power source supplying the constant voltage Vdd to be controlled by the first precharge signal PC1 inputted to the gates of the precharge transistors 200. The first precharge signal PC1 becomes the L level when it precharges the respective bit lines of the pair of bit lines, for example, BLn and BLn-bar, which brings the precharge transistors 200 of the PMOS transistors into conduction to reduce the potentials of the bit lines, for example, BLn and BLn-bar to Vdd.

Similarly, the precharge transistors 220 as the second precharge switches are PMOS transistors and are connected to the other ends of the respective bit lines of the pair of bit lines, for example, BLn and BLn-bar. Further, the pair of precharge transistors 220 are connected also to the power source supplying the constant voltage Vdd. Moreover, a precharge signal PC2 is inputted in common to the gates of the pair of precharge transistors 220. This enables the connection between the other ends of the respective bit lines of the pair of bit lines, for example, BLn and BLn-bar, and the power source supplying the constant voltage Vdd to be controlled by the second pre charge signal PC2 inputted to the gates of the precharge transistors 220. The second precharge signal PC2 becomes the L level when it precharges the respective bit lines of the pair of bit lines, for example, BLn and BLn-bar, as is the case with the first precharge signal PC1, which brings the precharge transistors 220 of the PMOS transistors into conduction so that the potentials of the bit lines, for example, BLn and BLn-bar surely become Vdd.

In addition to this, while the memory cell 110 corresponding to the precharge transistors 220, that is, the memory cell 110 connected to the bit lines, for example, BLn and BLn-bar are in a so-called standby state in which they do not read nor write data but hold data, the second precharge signal PC2 becomes the H level and brings the precharge transistors 220 into a cut-off state, that is, an OFF state.

Figure 7:
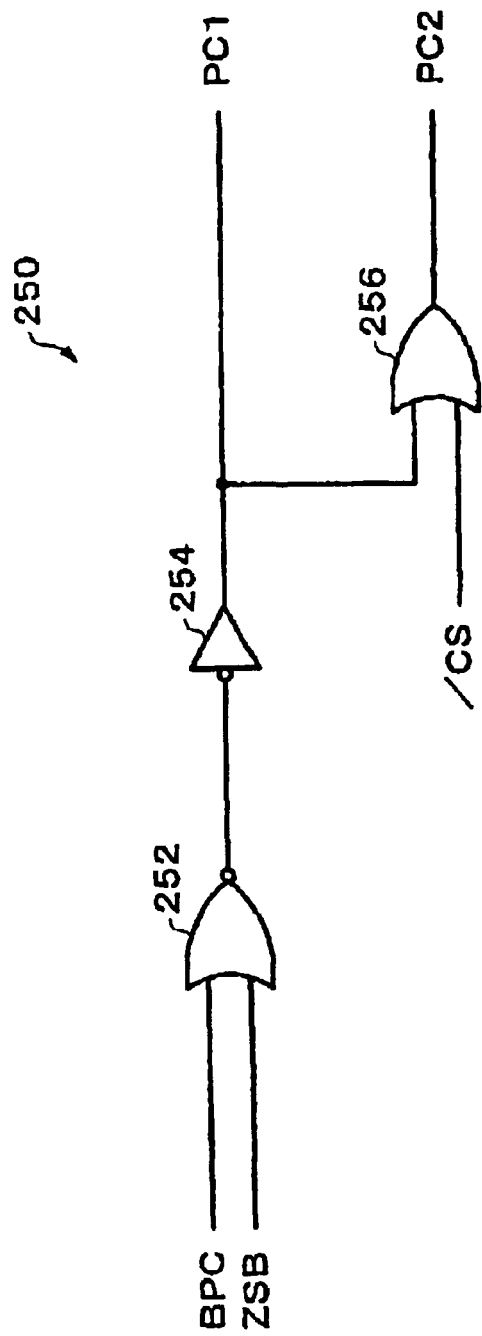
FIG. 7 is a block diagram showing an outline of a precharge signal generating circuit.

FIG. 7 is a block diagram showing the outline of a precharge signal generating circuit 250 generating the first and second precharge signals PC1 and PC2. As shown in this figure, the precharge signal generating circuit 250 like this is provided for each memory block 80 and includes a NOR gate 252, an inverter 254, and an OR gate. To the NOR gate 252 are inputted, for example, a precharge base signal BPC (low active) indicating a timing of precharging and a block selecting signal ZSB (low active) indicating that the selection of the block. A signal outputted from the NOR gate 252 is inverted by an inverter 254 to become the first precharge signal PC1. Moreover, the first precharge signal PC1 and the chip-select signal CS-bar (low active) are inputted to an OR gate 256 and outputted as the second precharge signal PC2.

Figure 8:
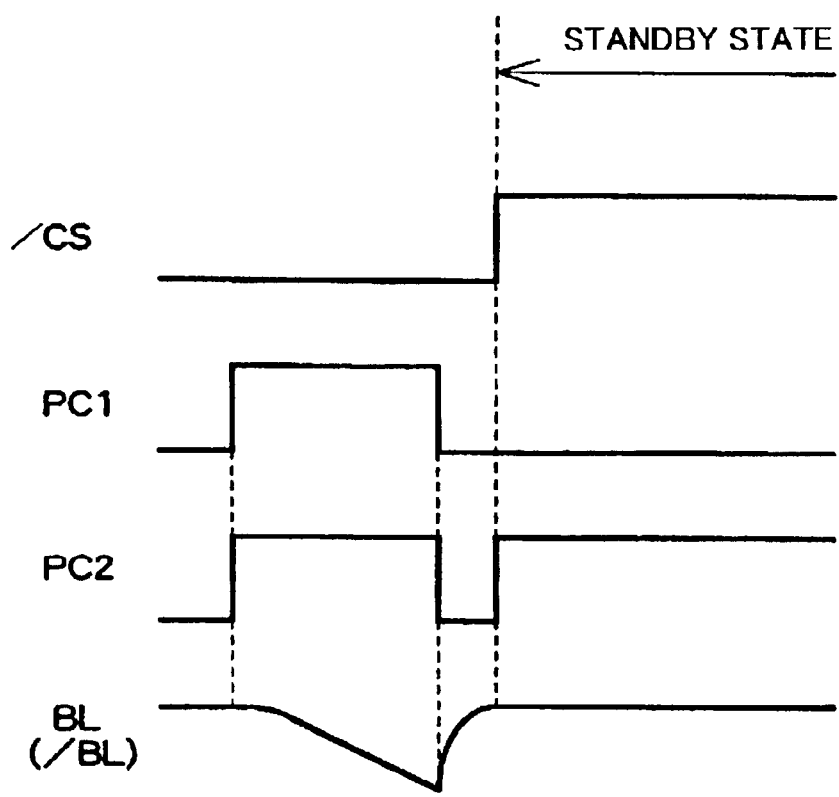
FIG. 8 illustrates a part of a signal relationship relating to a precharge signal generated by the precharge signal generating circuit shown in FIG. 7.

By the precharge signal generating circuit 250 like this, the first precharge signal PC1 becomes the L level in a case where the precharge base signal BPC is the L level and the block selecting signal ZSB is the L level, and in the other case, becomes the H level. In this manner, in a case where the precharge base signal BPC is the L level and the block selecting signal ZSB is the L level, the first precharge transistor 200 is turned ON and in the other case, is turned OFF. Moreover, the second precharge signal PC2 becomes the L level in a case where the first precharge signal PC1 is the L level and the chip-select signal CS-bar is the L level, and in the other case, becomes the H level. In this manner, in a case where the first precharge signal PC1 is the L level and the chip-select signal CS-bar is the L level, the second precharge transistor 220 is turned ON and in the other case, is turned OFF. FIG. 8 illustrates a part of a relationship of these signals.

Even in a case where a current failure is caused in the bit lines, for example, BLn and BLn-bar by a short circuit caused by a mixture of a foreign matter or the like, if reading data or writing data to the memory cell connected to the bit lines is prevented by the above-mentioned constitution of the first and second precharge transistors 220 and the precharge signal generating section 250, the precharge transistors 220 are kept in a cut-off state. As a result, an unnecessary current is prevented from flowing from the second precharge transistor 220 to a place where the short circuit occurs.

Moreover, in the first precharge transistor 200, in a case where the current failure is caused in the bit line, for example, BLn or BLn-bar, by cutting the fuse 63, an unnecessary current is prevented from flowing from the first precharge transistor 200 to a place where a short circuit or the like occurs.

Note that, the SRAM chip is constituted such that in a case where the current failure occurs in a bit line and reading data from or writing data to the memory cell connected to the bit line is prevented, in cooperation with cutting the fuse 63, a memory cell in the above-mentioned redundant memory block is used as a substitute.

Second Embodiment

An SRAM chip as a semiconductor memory device of a second embodiment is constituted and operated in the same way as the SRAM chip in the first embodiment except for points described below. Here, corresponding parts in the drawings are denoted by the same reference symbols as in the first embodiment.

Figure 9:
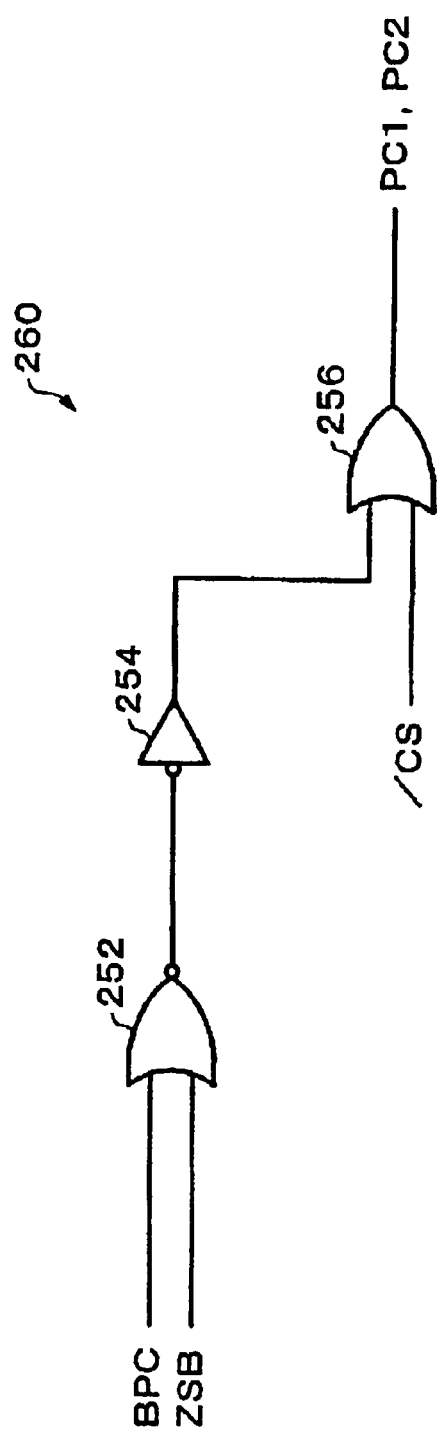
FIG. 9 is a block diagram showing an outline of a precharge signal generating circuit in a second embodiment.
Figure 10:
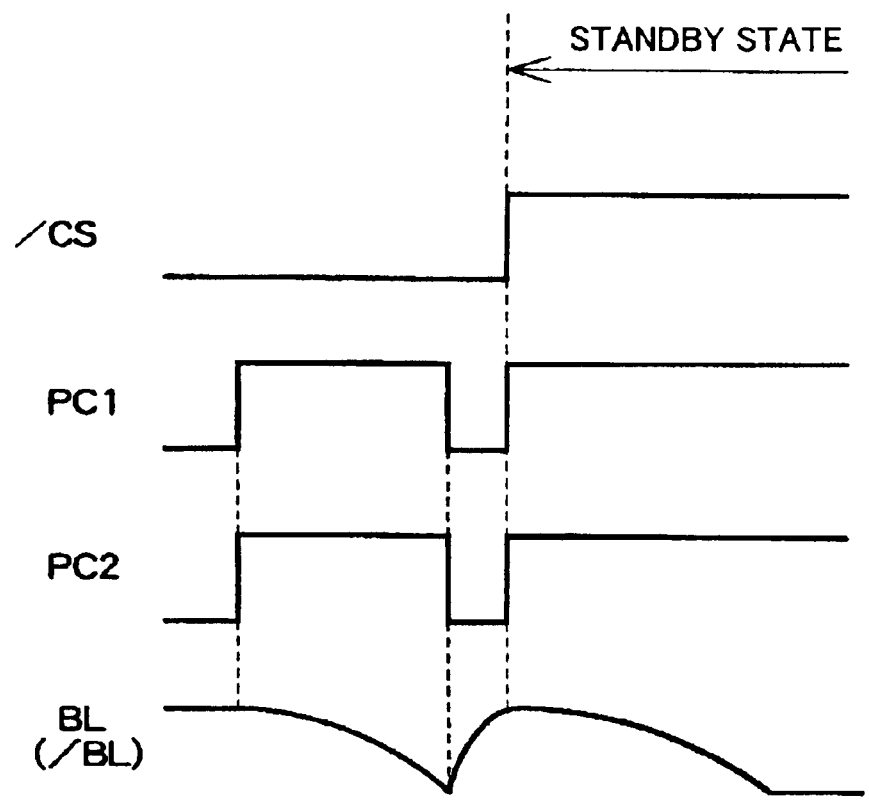
FIG. 10 illustrates a part of a signal relationship relating to a precharge signal generated by the precharge signal generating circuit shown in FIG. 9.

A precharge signal generating circuit 260 of the second embodiment, as shown in FIG. 9, is formed in the nearly same way as the precharge signal generating circuit 250 of the first embodiment and generates the same signal (precharge signal) as the first and second precharge signals PC1 and PC2. These precharge signals PC1 and PC2 become the L level in a case where the precharge base signal BPC is the L level and the block selecting signal ZSB is the L level and where the chip-select signal CS-bar is the L level, and the first and second pre-charge transistors 200 and 220 are turned ON. In the cases other than this, because the precharge signals PC1 and PC2 are the H level, the first and second precharge transistors 200 and 220 are turned OFF. FIG. 10 illustrates a partial relationship between these signals.

In the present embodiment, the first precharge transistor 200 is also brought to a cut-off state during a period in which the corresponding memory cell does not read or write data but holds data, that is, during a period of the standby state, so even in a case where the current failure is caused in a bit line by the short circuit, if reading data from or writing data to the memory cell connected to the bit line is prevented, then it is possible to prevent the unnecessary current from flowing from the first precharge transistor 200 to the short-circuited point. Therefore, it is also recommended that the fuse 63 for cutting the defective bit line be not provided but that the first precharge transistor 200 be directly connected to the power source having the potential Vdd.

Note that, the SRAM chip is constituted such that in a case where the current failure is caused in a bit line and reading data from or writing data to the memory cell connected to the bit line is prevented, the memory cell in the above-mentioned redundant memory block is used as a substitute.

Electronic Instrument

Figure 11A:
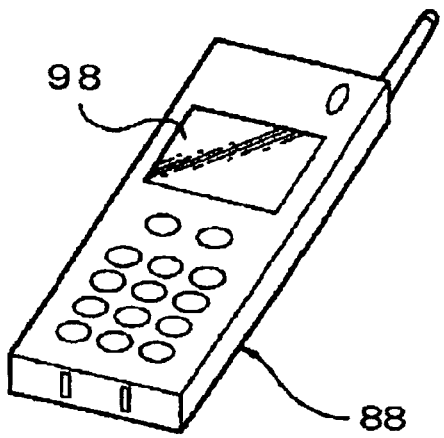
FIGS. 11A, 11B and 11C are external views showing electronic instruments using SRAM chips in any one of the embodiments.
Figure 11B:
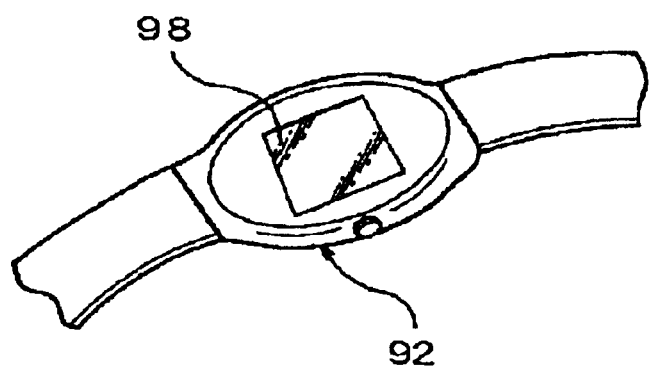
Figure 11C:
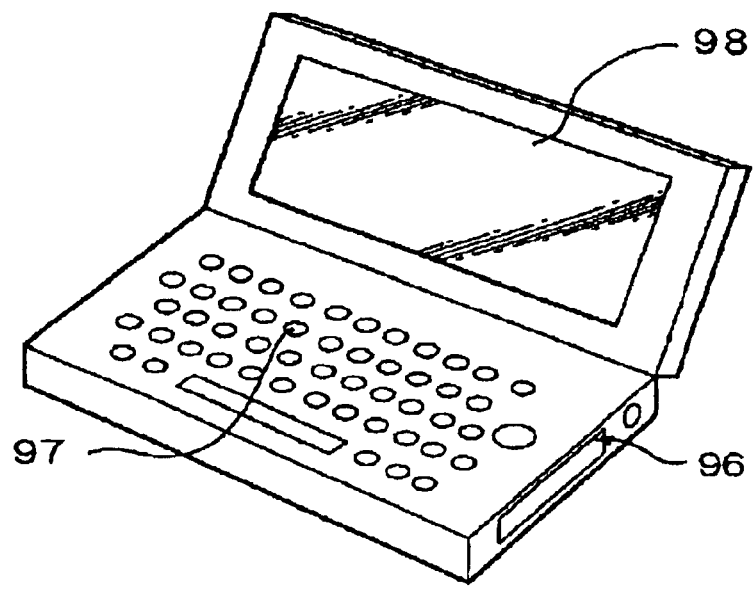

FIG. 11A, FIG. 11B, and FIG. 11C are external views showing examples of electronic instruments using the SRAM chips in any one of the above-mentioned embodiments. FIG. 11A is a cellular phone 88, FIG. 11B is a wrist watch 92, and FIG. 11C is a personal digital assistant 96.

These electronic instruments includes the SRAM chips in any one of the above-mentioned embodiments, a central processing unit (CPU), a display driver for driving the display 98, and the like. The respective parts including these are connected to each other by a buss line or the other signal transmission unit.

Note that, as the electronic instruments using the SRAM chips in any one of the above-mentioned embodiments are thought various kinds of electronic instruments such as not only the cellular phone, the wrist watch, and the personal digital assistant but also a notebook type personal computer, an electronic organizer, a pager, an electronic calculator, a POS terminal, an IC card, and a mini-disc player.

Modification

The present invention can be applied not to the SRAM but also to the other semiconductor memory device in which a bit line connected to the memory cell is precharged, for example, a DRAM.

In the above-mentioned respective embodiments have been shown examples in which the memory cells are formed in the regions where the respective sub word lines cross the respective pairs of bit lines. However, the present invention may be applied to a case where a distinction is not made between the main word line and the sub word line but only word lines are provided. In this case, the memory cells are formed in the regions where the respective word lines cross the respective pairs of bit lines.

The present invention is not limited to the above-mentioned respective embodiments but can be put into practice in various kinds of modifications within a spirit of the present invention or within a scope equivalent to the claims of the present invention.

What is claimed is:

1. A semiconductor memory device comprising:
a memory cell array including a plurality of memory cells arranged in a first direction and in a second direction;
a plurality of bit lines, each of the bit lines being connected in common to the plurality of memory cells arranged in the first direction;
a first precharge switch, connected to a potential supply line via a fuse and connected to one end of each of the bit lines, the potential supply line supplying a predetermined potential, and the first precharge switch connecting the potential supply line to each of the bit lines when the bit lines are precharged to the predetermined potential; and
a second precharge switch, connected to the potential supply line and connected to the other end of each of the bit lines, the second precharge switch connecting the potential supply line to each of the bit lines when the bit lines are precharged to the predetermined potential,
wherein the second precharge switch is in a cut-off state during a standby period in which memory cells corresponding to the second precharge switch hold data without reading and writing data.

2. The semiconductor memory device as defined by claim 1, further comprising a chip-select signal input terminal to which a chip-select signal is inputted, the chip-select signal controlling whether or not the memory cells are in a state to read and write data,
wherein each of the first and second precharge switches has a first terminal, a second terminal and a control terminal, a signal for controlling conduction between the first terminal and the second terminal being inputted to the control terminal,
wherein a first precharge signal is inputted to the control terminal of the first precharge switch, and
wherein a second precharge signal is inputted to the control terminal of the second precharge switch, the second precharge signal being generated based on the chip-select signal and the first precharge signal.

3. The semiconductor memory device as defined by claim 1,
wherein the memory cell array is divided into a plurality of block regions, and
wherein the first precharge signal becomes active when both a precharge base signal and a block selecting signal become active.

4. An electronic instrument having the semiconductor memory device as defined in claim 1.

5. The semiconductor memory device as defined by claim 3, further comprising a row decoder provided in each memory array.

6. A method for increasing the packing density of a semiconductor memory device comprising:
providing a memory cell array including a plurality of memory cells arranged in a first direction and in a second direction;
connecting in common a plurality of bit lines, each to the plurality of memory cells arranged in the first direction;
connecting a first precharge switch to a potential supply line via a fuse and to one end of each of the bit lines, the potential supply line supplying a predetermined potential, and the first precharge switch connecting the potential supply line to each of the bit lines when the bit lines are precharged to the predetermined potential; and
connecting a second precharge switch to the potential supply line and to the other end of each of the bit lines, the second precharge switch connecting the potential supply line to each of the bit lines when the bit lines are precharged to the predetermined potential,
wherein the second precharge switch is in a cut-off state during a standby period in which memory cells corresponding to the second precharge switch hold data without reading and writing data.

7. The method as defined by claim 6, further comprising controlling whether or not the memory cells are in a state to read and write data.

8. The method according to claim 7, further comprising controlling conduction between a first terminal and a second terminal of the first and second precharge switch.

9. The method according to claim 8, further comprising inputting first precharge signal to a control terminal of the first precharge switch.

10. The method according to claim 9, further comprising inputting a second precharge signal to a control terminal of the second precharge switch.

11. The method according to claim 6, further comprising dividing the memory arrays into a plurality of block region.

12. The method according to claim 6, further comprising activating a first precharge signal when both a precharge base signal and a block signal become active.

13. The method according to claim 6, further comprising providing a fuse between the potential supply line and a first precharge switch.

14. A semiconductor memory device comprising:
a memory cell array including a plurality of memory cells arranged in a first direction and in a second direction;
a plurality of bit lines, each of the lines being connected in common to the plurality of memory cells arranged in the first direction;
means for supplying a predetermined potential;
a first precharge switch connected to the means for supplying a predetermined potential via a fuse and connected to one end of each of the bit lines, and the first precharge switch connecting the means for supplying a predetermined potential to each of the bit lines when the bit lines are precharged to the predetermined potential; and
a second precharge switch connected to the means for supplying a predetermined potential and connected to the other end of each of the bit lines, the second precharge switch connecting the means for supplying a predetermined potential to each of the bit lines when the bit lines are precharged to the predetermined potential,
wherein the second precharge switch is in a cut-off state during a standby period in which memory cells corresponding to the second precharge switch hold data without reading and writing data.

* * * * *